(12) United States Patent
Hong

(10) Patent No.: US 8,264,663 B2
(45) Date of Patent: Sep. 11, 2012

(54) SYSTEM FOR ACCUMULATING EXPOSURE ENERGY INFORMATION OF WAFER AND MANAGEMENT METHOD OF MASK FOR EXPOSURE UTILIZING EXPOSURE ENERGY INFORMATION OF WAFER ACCUMULATED WITH THE SYSTEM

(75) Inventor: Woon-Sig Hong, Gwangju-Si (KR)

(73) Assignee: Cymer Korea Inc., Pyungtaek (KR)

( * ) Notice: Subject to any disclaimer, the term of this patent is extended or adjusted under 35 U.S.C. 154(b) by 1276 days.

(21) Appl. No.: 11/956,259

(22) Filed: Dec. 13, 2007

(65) Prior Publication Data

US 2008/0175467 A1 Jul. 24, 2008

(30) Foreign Application Priority Data

Jan. 18, 2007 (KR) ........................ 10-2007-0005539

(51) Int. Cl.
*G03B 27/52* (2006.01)
*G01N 21/00* (2006.01)
*G06K 9/00* (2006.01)
(52) U.S. Cl. ........................ 355/30; 382/144; 356/432
(58) Field of Classification Search ................... 355/53, 355/77, 30, 70; 700/121; 356/432; 382/144
See application file for complete search history.

(56) References Cited

U.S. PATENT DOCUMENTS

| | | | | |
|---|---|---|---|---|
| 5,243,377 A * | 9/1993 | Umatate et al. | ................. | 355/53 |
| 6,414,744 B1 * | 7/2002 | Kuiper et al. | ................... | 355/75 |
| 6,445,441 B1 * | 9/2002 | Mouri | .............................. | 355/53 |
| 6,687,562 B2 * | 2/2004 | Patel et al. | ..................... | 700/121 |
| 6,697,695 B1 * | 2/2004 | Kurihara et al. | .............. | 700/121 |
| 7,127,311 B2 * | 10/2006 | Kemmoku | ..................... | 700/100 |
| 7,251,033 B1 * | 7/2007 | Phan et al. | ..................... | 356/432 |
| 8,041,106 B2 * | 10/2011 | Tung-Sing Pak et al. | .... | 382/149 |
| 2002/0024647 A1 * | 2/2002 | Nakahara et al. | .............. | 355/53 |
| 2004/0130711 A1 * | 7/2004 | Werf et al. | ................. | 356/237.2 |

FOREIGN PATENT DOCUMENTS

JP 2002-015986 A 1/2002

* cited by examiner

*Primary Examiner* — Hung Henry Nguyen
*Assistant Examiner* — Steven H Whitesell Gordon
(74) *Attorney, Agent, or Firm* — Birch, Stewart, Kolasch & Birch, LLP

(57) ABSTRACT

Disclosed is a management method of a mask for exposure utilizing exposure energy information of a wafer. According to the present invention, in case of exposing wafers in exposure apparatuses, information on masks loaded on exposure apparatuses are calculated from the exposure apparatuses, the light energy values applied during the exposure of wafers by the corresponding masks are calculated, the calculated light energy values are stored in the data server, the same data are collected from all wafer exposure processes performed at plural exposure apparatuses within the semiconductor FAB and the exposure information about the exposure energy relating to plural masks used by plural exposure apparatuses are accumulated and managed. Accordingly, the exposure degree of a mask about the exposure energy, as a direct cause of the contamination of masks such as the crystal growth and haze, is directly calculated and then defects of masks are predicted together with measures according that, so that deterioration of the yield of the semiconductor is prevented and the yield of the semiconductor is increased.

20 Claims, 2 Drawing Sheets

SYSTEM FOR ACCUMULATING EXPOSURE ENERGY INFORMATION OF WAFER AND MANAGEMENT METHOD OF MASK FOR EXPOSURE UTILIZING EXPOSURE ENERGY INFORMATION OF WAFER ACCUMULATED WITH THE SYSTEM

BACKGROUND OF THE INVENTION

1. Field of the Invention

The present invention relates to a system for accumulating exposure energy information of a wafer and a management method of a mask for exposure utilizing exposure energy information of the wafer accumulated with the system in which in a photo lithography process of a semiconductor, the exposure degree of the mask relating to the exposure energy as direct causes of the mask contamination such as the crystal growth and haze is directly accumulated and calculated by using the light energy information caused by the wafer exposure executed by means of an original plate (mask/reticle) with a circuit patterned by an exposing apparatus such as a stepper/scanner, thereby predicting a defect of the mask and accordingly then increasing the yield of a semiconductor.

2. Description of the Related Art

Generally, in an exposing apparatus such as a stepper/scanner, which had been widely used conventionally, a light source such as a mercury lamp or an excimer laser is used as an exposure energy source in order to form a pattern on the wafer and then the light generated from the light source is passed through the mask/reticle with the incised circuit and reached finally to the wafer with the coated photo resist, so that the pattern on the mask/reticle is transferred to the wafer.

Recently, the circuit pattern is formed minutely more and more and accordingly, a light source with a short wavelength range (365 nm(I-Line lamp)→248 nm(KrF)→193 nm(ArF)→15 nm(EUV)) is used in order to obtain the enhanced resolution. According this, a mask is exposed to high light energy and also, the diameter of a wafer is increased like 200 mm, 300 mm and 450 mm, the exposure energy and exposure time per the wafer are increased, so that the mask is exposed to the high light energy during the long time. By the rising action like this, the mask contamination such as the crystal growth and the haze is progressed more rapidly and the more serious mask defect is generated.

And, in the conventional art, the management of the mask has been performed arbitrarily by measuring the crystal on a mask or the degree of contamination without information on the exposing energy as the direction reason of the contamination as the occasion demands. According this, there are several disadvantages that the preventive management can not be performed and the yield of the semiconductor can not be increased according to the use of the contaminated mask.

SUMMARY OF THE INVENTION

Therefore, the present invention has been made in view of the above mentioned problems, and an object of the invention is to provide a system for accumulating exposure energy information of a wafer and a management method of a mask for exposure utilizing exposure energy information of the wafer accumulated with the system in which the exposure energy exposure information of the mask exposed by the exposure energy are accumulated and managed so that a defect of the mask is detected.

Another object of the invention is to provided a system for accumulating exposure energy information of a wafer and a management method of a mask for exposure utilizing exposure energy information of the wafer accumulated with the system in which the badness of the wafer generated due to the exposure of the wafer by means of a contaminated mask is prevented so that the yield of the semiconductor is increased.

In accordance with one aspect, the present invention provides a system for accumulating exposure energy information of a wafer: first to n-th light sources for generating light energy for exposure, first to n-th exposure apparatuses for receiving the exposure light energy generated from the first to n-th light sources through the first to n-th light transmission systems including a lens and a reflection mirror and the like and then exposing wafers through the first to n-th exposure masks, a data server for receiving the exposure energy values used for exposing the wafers at the first to n-th exposure apparatuses, accumulating and calculating the exposure energy used to the exposure at real time, and network lines connected respectively with the first to n-th exposure apparatuses and the data server in order to transmit the exposure energy values calculated by the data server to a control room server.

In accordance with another aspect, the present invention provides a management method of a mask for exposure utilizing the exposure energy information accumulated with a system for accumulating the exposure energy information of wafers comprising: a mask loading process in which the new first to n-th exposure masks are loaded on the mask stages of the first to n-th exposure apparatuses, an exposure mask ID transmission process in which the first to n-th exposure apparatuses read IDs (Serial Numbers) of the first to n-th exposure masks, respectively, which are loaded to the mask stages of the first to n-th exposure apparatuses at the mask loading process and transmit the read IDs to a data server through network lines, a light generation signal output process in which after the exposure mask ID transmission process, the first to n-th exposure apparatuses output light generation signals to the first to n-th light sources, an exposure energy value output process in which the first to n-th exposure apparatuses receive the exposure light energy generated from the first to n-th light sources according to the light generation signals outputted from the light generation signal output process through the first to n-th light transmission systems including a lens and a reflection mirror and the like, make wafers expose through the first to n-th exposure masks, measure the exposure energy values required for exposure and output the measured exposure energy values to the data server, a mask unloading process in which at the exposure energy value output process, when the respective exposure energy values required for exposing wafers are outputted to the data server and the exposure process is finished at the first to n-th exposure apparatuses, the first to n-th masks are unloaded from mask stages of the first to n-th exposure apparatuses, an exposure energy accumulation and calculation process by masks in which in the mask unloading process, when the first to n-th exposure apparatuses output the unloading finish information of the first to n-th masks to the data server, the data server accumulates and calculates the exposure energy data by the first to n-th masks, an exposure energy management process by masks in which at the exposure energy accumulation and calculation process by masks, the data server manages the exposure energy data accumulated and calculated by the first to n-th masks, and an exposure energy accumulation value output process by masks in which the data server outputs the exposure energy accumulation values by masks to the control room server so that users of masks and a mask inspector recognize the calculated exposure energy data by masks.

BRIEF DESCRIPTION OF THE DRAWINGS

The above objects, and other features and advantages of the present invention will become more apparent after a reading of the following detailed description when taken in conjunction with the drawings, in which.

DESCRIPTION OF THE PREFERRED EMBODIMENTS

Now, the present invention will be described in detail with reference to the annexed drawings.

Figure 1:
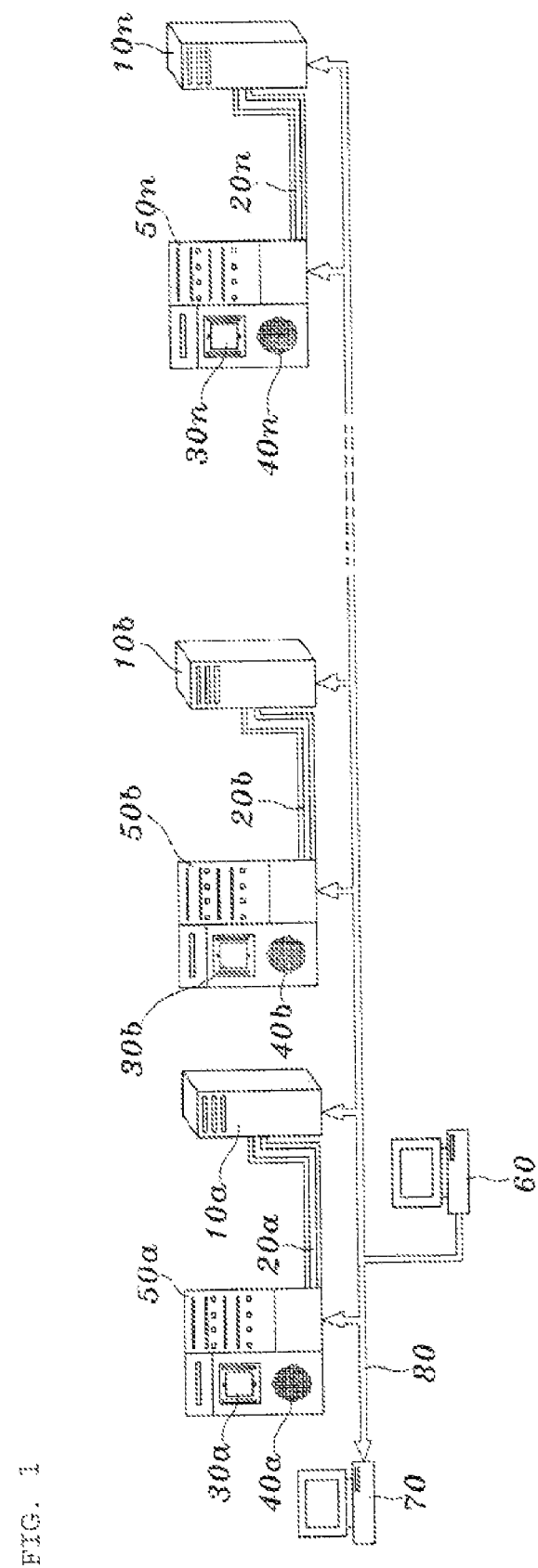
FIG. 1 is a view schematically illustrating a system for accumulating exposure energy information of a wafer according to an embodiment of the present invention.

FIG. 1 is a view schematically illustrating a system for accumulating exposure energy information of a wafer according to an embodiment of the present invention.

As shown in FIG. 1, a system for accumulating exposure energy information of a wafer according to an embodiment of the present invention includes: the first to n-th light sources 10a,10b, . . . , 10n for generating light energy for exposure, the first to n-th exposure apparatuses 50a,50b, . . . , 50n for receiving the exposure light energy generated from the first to n-th light sources 10a,10b, . . . , 10n through the first to n-th light transmission systems 20a,20b, . . . , 20n including a lens and a reflection mirror and the like and then exposing wafers 40a,40b, . . . , 40n through the first to n-th exposure masks 30a,30b, . . . , 30n, a data server 60 for receiving the exposure energy values used for exposing the wafers at the first to n-th exposure apparatuses 50a,50b, . . . , 50n, accumulating and calculating the exposure energy used to the exposure at real time, and network lines 80 connected respectively with the first to n-th exposure apparatuses 50a,50b, . . . , 50n and the data server 60 in order to transmit the exposure energy values calculated by the data server 60 to a control room server 70.

The operation and effect of a system for accumulating exposure energy information of a wafer according to an embodiment of the present invention will be described hereinafter.

Firstly, when the new first to n-th exposure masks 30a, 30b, . . . , 30n are loaded at the first to n-th exposure apparatuses 50a,50b, . . . , 50n, respectively, in order to perform the exposure of wafers 40a,40b, . . . , 40n, the first to n-th exposure apparatuses 50a,50b, . . . , 50n read IDs (Serial Numbers) of the first to n-th exposure masks 30a,30b, . . . , 30n, respectively, and transmit the read IDs to the data server 60 through network lines 80.

Next, the first to n-th exposure apparatuses 50a,50b, . . . , 50n receive the exposure light energy generated at the first to n-th light sources 10a,10b, . . . , 10n through the first to n-th light transmission systems 20a,20b, . . . , 20n including a lens and a reflection mirror and the like and start the exposure of wafers 40a,40b, . . . , 40n through the first to n-th exposure masks 30a,30b, . . . , 30n. When the exposure of wafers 40a,40b, . . . , 40n is finished, the light energy values used for exposing the corresponding wafers 40a,40b, . . . , 40n are transmitted to the data server 60. The wafers 40a,40b, . . . , 40n are continuously exposed at the first to n-th exposure apparatuses 50a,50b, . . . , 50n and then the data server 60 accumulates continuously the light energy information (data) used for exposing the wafers 40a,40b, . . . , 40n, which are provided by the first to n-th exposure apparatuses 50a,50b, . . . , 50n, relating to the corresponding first and n-th masks 30a, 30b, . . . , 30n.

When the exposure of wafers 40a,40b, . . . , 40n is completed and the first to n-th exposure masks 30a,30b, . . . , 30n are unloaded from mask stages of the first to n-th exposure apparatuses 50a,50b, . . . , 50n, unload signals about the first to n-th exposure masks 30a,30b, . . . , 30n are transmitted from the first to n-th exposure apparatuses 50a,50b, . . . , 50n to the data server 60 and then the data server 60 accumulates and calculates the exposure information about light energy of the first to n-th exposure masks 30a,30b, . . . , 30n.

As described above, when data from the first to n-th exposure apparatuses 50a,50b, . . . , 50n within the semiconductor FAB (Fabrication) are transmitted to the data server 60, the data server 60 accumulates and calculates exposure information about light energy of the first to n-th exposure masks 30a,30b, . . . , 30n used at the first to n-th exposure apparatuses 50a,50b, . . . , 50n.

The data server 60 predicts the defects of the first to n-th exposure masks 30a,30b, . . . , 30n on the basis of exposure data about light energy accumulated by the first to n-th exposure masks 30a,30b, . . . , 30n and outputs the exposure data to the control room server 70 so that users of the first to n-th exposure masks 30a,30b, . . . , 30n and a mask inspector recognize the prevention information related to the contamination of the first to n-th exposure masks 30a,30b, . . . , 30n.

Next, a management method of a mask for exposure utilizing exposure energy information of wafers according to the embodiment of the present invention will be described.

Figure 2:
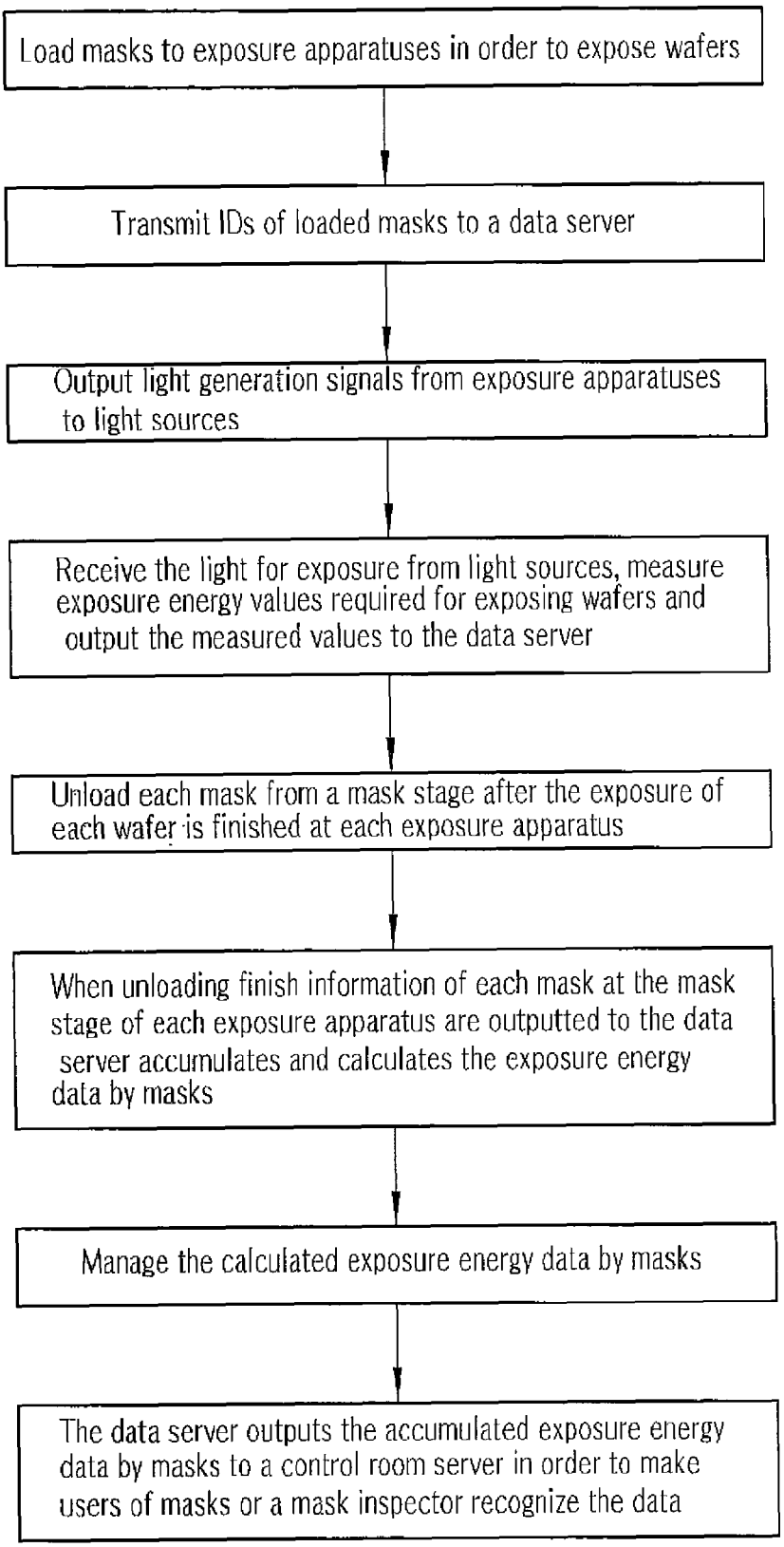
FIG. 2 is a flow chart illustrating a management method of a mask for exposure utilizing exposure energy information of the wafer accumulated with the system according to an embodiment of the present invention.

FIG. 2 is a flow chart illustrating a management method of a mask for exposure utilizing exposure energy information of the wafer accumulated with the system according to an embodiment of the present invention.

Firstly, as shown in FIG. 2, the new first to n-th exposure masks 30a,30b, . . . , 30n are loaded on the mask stages of the first to n-th exposure apparatuses 50a,50b, . . . , 50n (mask loading process), and the first to n-th exposure apparatuses 50a,50b, . . . , 50n read IDs (Serial Numbers) of the first to n-th exposure masks 30a,30b, . . . , 30n, respectively, which are loaded to the mask stages of the first to n-th exposure apparatuses 50a,50b, . . . , 50n at the mask loading process and transmit the read IDs to the data server 60 through network lines 80 exposure mask ID transmission process).

After the exposure mask ID transmission process, the first to n-th exposure apparatuses 50a,50b, . . . , 50n output light generation signals to the first to n-th light sources 10a, 10b, . . . , 10n (light generation signal output process), receive the exposure light energy generated from the first to n-th light sources 10a,10b, . . . , 10n according to the light generation signals outputted from the light generation signal output process through the first to n-th light transmission systems 20a, 20b, . . . , 20n including a lens and a reflection mirror and the like, make wafers 40a,40b, . . . , 40n expose through the first to n-th exposure masks 30a,30b, . . . , 30n, measure the exposure energy values required for exposure and output the measured exposure energy values to the data server 60 exposure energy value output process).

At the exposure energy value output process, when the respective exposure energy values required for exposing wafers 40a,40b, . . . , 40n are outputted to the data server 60 and the exposure process is finished at the first to n-th exposure apparatuses 50a,50b, . . . , 50n, the first to n-th masks 30a,30b, . . . , 30n are unloaded from mask stages of the first to n-th exposure apparatuses 50a,50b, . . . , 50n (mask unloading process), and in the mask unloading process, when the first to n-th exposure apparatuses 50a,50b, . . . , 50n output the unloading finish information of the first to n-th masks 30a, 30b, ..., 30n to the data server 60, the data server 60 accumulates and calculates the exposure energy data by the first to n-th masks 30a,30b, ..., 30n (exposure energy accumulation and calculation process by masks).

At the exposure energy accumulation and calculation process by masks, the data server 60 manages the exposure energy data accumulated and calculated by the first to n-th masks 30a,30b, ..., 30n (exposure energy management process by masks) and thereafter outputs the exposure energy accumulation values by masks to the control room server 70 so that users of masks and a mask inspector recognize the calculated exposure energy data by masks (exposure energy accumulation value output process by masks).

Accordingly, according to the present invention, in case of exposing wafers in exposure apparatuses, information on masks loaded on exposure apparatuses are calculated from the exposure apparatuses, the light energy values applied during the exposure of wafers by the corresponding masks are calculated, the calculated light energy values are stored in the data server, the same data are collected from all wafer exposure processes performed at plural exposure apparatuses within the semiconductor FAB and the exposure information about the exposure energy relating to plural masks used by plural exposure apparatuses are accumulated and managed. Accordingly, the exposure degree of a mask about the exposure energy, as a direct cause of the contamination of masks such as the crystal growth and haze, is directly calculated and then defects of masks are predicted together with measures according that, so that deterioration of the yield of the semiconductor is prevented and the yield of the semiconductor is increased.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

Accordingly, according to the present invention, there are several advantages that in case of exposing wafers in exposure apparatuses, information on masks loaded on exposure apparatuses are calculated from the exposure apparatuses, the light energy values applied during the exposure of wafers by the corresponding masks are calculated, the calculated light energy values are stored in the data server, the same data are collected from all wafer exposure processes performed at plural exposure apparatuses within the semiconductor FAB and the exposure information about the exposure energy relating to plural masks used by plural exposure apparatuses are accumulated and managed. Accordingly, the exposure degree of a mask about the exposure energy, as a direct cause of the contamination of masks such as the crystal growth and haze, is directly calculated and then defects of masks are predicted together with measures according that, so that deterioration of the yield of the semiconductor is prevented and the yield of the semiconductor is increased.

What is claimed is:

1. A management method of a mask for exposure utilizing the exposure energy information accumulated with a system for accumulating the exposure energy information of wafers, the method comprising:
   a mask loading process in which new first to n-th exposure masks are loaded on the mask stages of first to n-th exposure apparatuses,
   an exposure mask ID transmission process in which the first to n-th exposure apparatuses read IDs(Serial Numbers) of the first to n-th exposure masks, respectively, which are loaded to the mask stages of the first to n-th exposure apparatuses at the mask loading process and transmit the read IDs to a data server through network lines,
   a light generation signal output process in which after the exposure mask ID transmission process, the first to n-th exposure apparatuses output light generation signals to first to n-th light sources,
   an exposure energy value output process in which the first to n-th exposure apparatuses receive the exposure light energy generated from the first to n-th light sources according to the light generation signals outputted from the light generation signal output process through first to n-th light transmission systems, expose wafers through the first to n-th exposure masks, measure the exposure energy values required for exposure and output the measured exposure energy values to the data server,
   a mask unloading process in which at the exposure energy value output process, when the respective exposure energy values required for exposing wafers are outputted to the data server and the exposure process is finished at the first to n-th exposure apparatuses, the first to n-th masks are unloaded from mask stages of the first to n-th exposure apparatuses,
   an exposure energy accumulation and calculation process by masks in which in the mask unloading process, when the first to n-th exposure apparatuses output the exposure energy values of the first to n-th masks to the data server, the data server accumulates and calculates the exposure energy data by the first to n-th masks,
   an exposure energy management process by masks in which at the exposure energy accumulation and calculation process by masks, the data server manages the exposure energy data accumulated and calculated by the first to n-th masks, and
   an exposure energy accumulation value output process by masks in which the data server outputs the exposure energy accumulation values by masks to the control room server so that users of masks and a mask inspector recognize the calculated exposure energy data by masks.

2. A system for accumulating exposure energy information of a wafer, comprising:
   a plurality of exposure apparatuses;
   an exposure mask in each exposure apparatus;
   a wafer in each exposure apparatus;
   a plurality of light sources connected to the plurality of exposure apparatuses; and
   a controller configured to measure the energy value that exposed the wafers for each exposure apparatus, accumulate the energy values and determine if any mask is contaminated based on the accumulated energy values.

3. The system of claim 2, wherein the controller is further configured to read identifications from each mask.

4. The system of claim 3, wherein the identifications are serial numbers.

5. The system of claim 2, wherein a number of exposure apparatuses equals a number of light sources.

6. The system of claim 2, further comprising light transmission systems connecting the plurality of light sources to the plurality of exposure apparatuses.

7. The system of claim 6, wherein a number of light transmission systems is equal to a number of exposure apparatuses.

8. The system of claim 6, wherein a number of light transmission systems is equal to a number of exposure apparatuses and a number of light sources.

9. The system of claim 2, wherein the controller is further configured to continuously accumulate light energy information used for exposing the plurality of wafers.

10. The system of claim 2, wherein the controller is a data server, and further comprising a network line connecting the data server to each light source and each exposure apparatus.

11. The system of claim 10, further comprising control room server connected to the data server.

12. The system of claim 2, wherein the exposure apparatuses generate unload signals upon completing exposure of the wafers.

13. A method for accumulating exposure energy information of a wafer, comprising:
    loading an exposure mask into each of a plurality of exposure apparatuses;
    loading a wafer into each of the exposure apparatuses;
    outputting light from a plurality of light sources to expose the wafers through the exposure masks;
    measuring the energy value of the output light to expose each wafer;
    accumulating the energy values; and
    determining if any mask is contaminated based on the accumulated energy values.

14. The method of claim 13, further comprising reading identifications from each mask.

15. The method of claim 13, wherein a number of exposure apparatuses equals a number of light sources.

16. The method of claim 13, further comprising unloading each mask after exposure of each wafer is completed.

17. The method of claim 13, further comprising continuously accumulating the energy values for each of the plurality of wafers.

18. The method of claim 13, further comprising outputting light from the plurality of light sources through a plurality of light transmission systems connected between the plurality of light sources and the plurality of exposure apparatuses.

19. The method of claim 18, wherein a number of light transmission systems is equal to a number of exposure apparatuses and a number of light sources.

20. The method of claim 13, further comprising unloading the masks upon completion of exposing the wafers.

* * * * *